United States Patent
Pence et al.

(10) Patent No.: US 6,688,381 B2
(45) Date of Patent: Feb. 10, 2004

(54) MULTISCALE TRANSPORT APPARATUS AND METHODS

(75) Inventors: Deborah V. Pence, Corvallis, OR (US); Jose N. Reyes, Jr., Corvallis, OR (US); Nathan Phillips, Brighton, MA (US); Qiao Wu, Portland, OR (US); John T. Groome, Corvallis, OR (US)

(73) Assignee: The State of Oregon Acting by and through the State Board of Higher Education on Behalf of Oregon State University, Corvallis, OR (US)

( * ) Notice: Subject to any disclaimer, the term of this patent is extended or adjusted under 35 U.S.C. 154(b) by 0 days.

(21) Appl. No.: 09/875,449

(22) Filed: Jun. 5, 2001

(65) Prior Publication Data

US 2002/0080563 A1 Jun. 27, 2002

Related U.S. Application Data

(60) Provisional application No. 60/209,538, filed on Jun. 5, 2000.

(51) Int. Cl.[7] .............................. F28F 3/00; H05K 7/20
(52) U.S. Cl. ..................... 165/168; 165/80.4; 165/146; 165/170; 165/139; 257/714; 361/699
(58) Field of Search ................. 165/80.4, 139, 165/146, 147, 168, 170; 361/699; 257/714

(56) References Cited

U.S. PATENT DOCUMENTS

| | | | |
|---|---|---|---|
| 485,315 A | * 11/1892 | Yaryan | 165/146 |
| 2,006,649 A | * 7/1935 | Modine | 165/146 |
| 3,923,383 A | 12/1975 | Engel et al. | |
| 4,049,051 A | * 9/1977 | Parker | 165/146 |
| 4,386,505 A | 6/1983 | Little | 165/168 |
| 4,715,438 A | * 12/1987 | Gabuzda et al. | 165/185 |
| 4,765,397 A | * 8/1988 | Chrysler et al. | 164/146 |
| 5,088,005 A | 2/1992 | Ciaccio | |
| 5,388,635 A | 2/1995 | Gruber et al. | |
| 5,640,046 A | * 6/1997 | Suzuki et al. | 257/714 |

FOREIGN PATENT DOCUMENTS

| | | | | |
|---|---|---|---|---|
| FR | 2549585 | * | 1/1985 | 165/170 |

* cited by examiner

*Primary Examiner*—Leonard Leo
(74) *Attorney, Agent, or Firm*—Klarquist Sparkman, LLP (57) ABSTRACT

Thermal management devices and methods include branching networks comprising flow channels of varying cross-sectional area. The branching networks can be fractal-like in nature with an increase in the total flow area following a flow channel bifurcation. In representative embodiments, the branching networks are defined in a channel pattern that is laminated between cover plates to form a thermal management device. The channel pattern includes bridging portions so that the branching network is defined with a single pattern piece. The branching networks can exhibit radial symmetry or be aligned with respect to one or more axes. Heat exchangers and diffusive mixers that include such networks are also provided.

18 Claims, 6 Drawing Sheets

MULTISCALE TRANSPORT APPARATUS AND METHODS

This application claims priority from U.S. Provisional Patent Application No. 60/209,538 filed on Jun. 5, 2000, which is incorporated herein by reference.

FIELD OF THE INVENTION

The invention pertains to thermal and mass transport devices.

BACKGROUND

Micro-channels can provide heat transfer for cooling of, for example, electronic devices such as integrated circuits. While micro-channels can provide enhanced heat transfer, such enhanced heat transfer is generally accompanied by an increase in the pump power needed to force a heat transfer fluid through the micro-channels. In addition, micro-channel based heat sinks typically exhibit significant non-uniformity in heat sink surface temperatures.

Tapered micro-channels can be configured to exhibit a lower cross-sectional thermal resistance at a channel exit than at a channel inlet. Such a configuration can reduce downstream wall surface temperatures, thereby producing a more uniform temperature distribution of the heated surface. However, a decrease in axial channel diameter requires an increase in flow velocity and increased pump power.

In view of these shortcomings, improved heat sinks and thermal management devices and methods are needed.

SUMMARY

The present invention provides methods and apparatus that produce, in representative embodiments, increased temperature uniformity of a heated surface while decreasing a pressure drop in an associated heat transfer fluid used to remove heat from the heated surface. Heat transport is achieved with a flow resistance based on a series of consecutively branching flow channels. Such flow channels form branching networks that exhibit efficient transport characteristics similar to those of biological systems.

Thermal management devices ("TMDs") are provided that include an inlet configured to receive a fluid and a branching network situated to receive the fluid from the inlet. The TMDs also include an outlet configured to receive the fluid from the branching network. According to representative embodiments, the branching network includes flow channels corresponding to at least three branching levels. In a particular example, the branching network includes m branching levels having flow channels configured so that $$\beta = \frac{d_{k+1}}{d_k} = n^{-1/3}, \text{ and}$$

$$\gamma = \frac{L_{k+1}}{L_k} = n^{-1/D},$$

wherein $d_k$ and $L_k$ are a flow channel diameter and a channel length of a flow channel in a $k^{th}$ branching level, $\gamma$ and $\beta$, are ratios of channel diameters and channel lengths, respectively, n is a number of branches into which a single channel bifurcates, and D is a branching network dimensionality. According to additional examples, the diameters $d_k$ are hydraulic diameters and the flow channels are directed substantially radially with respect to the inlet.

According to additional embodiments, TMDs includes a branching network having m branching levels with flow channels configured so that $$\frac{L_{k+1}}{L_k} = n^{-1/D}, \text{ and}$$

$$\frac{w_{k+1}}{w_k} = n^{-2/3},$$

wherein $w_k$ and $L_k$ are a flow channel cross-sectional area and a channel length of a flow channel in a $k^{th}$ branching level, respectively, n is a number of branches into which a single channel bifurcates, and D is a branching network dimensionality. In a particular example, D=2 and the flow channels extend along a flow axis.

Heat sinks are provided that include at least one cover layer and a branching network configured to conduct a fluid flow. The branching network is bonded to the cover layer to define flow channels. The cover layer or layers can define a fluid inlet or outlet, and the branching network can be a fractal network.

Thermal management devices are provided that include a branching network pattern layer and first and second cover layers attached to the branching network pattern layer. In representative embodiments, the branching network pattern layer includes m branching levels having flow channels configured so that $$\frac{L_{k+1}}{L_k} = n^{-1/D}, \text{ and}$$

$$\frac{w_{k+1}}{w_k} = n^{-2/3},$$

wherein $w_k$ and $L_k$ are a flow channel cross-sectional area and a channel length of a flow channel in a $k^{th}$ branching level, respectively, n is a number of branches into which a single channel bifurcates, and D is a branching network dimensionality.

Heat exchangers are provided that include a cover plate having a heat transfer surface and a branching channel network layer that is bonded to the cover plate. The branching channel network layer is configured to transport a heat transfer fluid to receive heat from the heat transfer surface. In some embodiments, the branching channel network layer defines a fractal flow channel pattern.

Flow networks are provided that include a first branching level that includes at least one first-level flow channel defined by a first set of dimensions and a second branching level that includes second-level flow channels defined by a second set of dimensions. The second branching level includes at least two second-level flow channels for each of the first-level flow channels.

According to a further embodiment, a flow network includes m branching levels having flow channels configured so that $$\frac{L_{k+1}}{L_k} = n^{-1/D}, \text{ and}$$

$$\frac{w_{k+1}}{w_k} = n^{-2/3},$$

wherein $w_k$ and $L_k$ are a flow channel cross-sectional area and a channel length of a flow channel in a $k_{th}$ branching level, respectively, n is a number of branches into which a single channel bifurcates, and D is a branching network dimensionality. In a particular example, the flow networks are two dimensional and D=2.

Methods of manufacturing a thermal management device include providing a top layer and a bottom layer and defining a branching network in a branching layer. The top layer is bonded to a first surface of the branching layer and the bottom layer is bonded to a second surface of the branching layer. According to additional embodiments, the branching layer is provided with bridge portions and a perimeter portion wherein the bridge portions and the perimeter portion are configured to interconnect pattern portions corresponding to at least two branching levels. At least a portion of the perimeter portion is removed after the branching network is bonded to either the top layer or the bottom layer. In still further embodiments, a fractal pattern is selected for the branching network.

Fluid mixers include a branching network of fluid channels, wherein the fluid channels are configured to receive at least two fluids. In a specific example, the fluid channels are configured so that $$\frac{L_{k+1}}{L_k} = n^{-1/D}, \text{ and}$$

$$\frac{w_{k+1}}{w_k} = n^{-2/3},$$

wherein $w_k$ and $L_k$ are a flow channel cross-sectional area and a channel length of a flow channel in a $k_{th}$ branching level, respectively, n is a number of branches into which a single channel bifurcates, and D is a branching network dimensionality.

These and other features and advantages of the invention are set forth below with reference to the accompanying drawings.

DETAILED DESCRIPTION

Thermal management devices ("TMDs") such as heat sinks and heat exchangers and associated methods include branching networks that can be fractal-like or non-fractal-like. A fractal-like network is a network that lacks a characteristic length scale, but exhibits a multitude of scales with small-scale structures self-similar to larger scale structures. Network branching results in an increased number of smaller diameter channels and, in some examples, an increase in a total cross-sectional flow area. Increases in the cross-sectional flow area across each branching level typically reduce power needed to produce flow through the branching network and reduce cross-sectional thermal resistance. (Cross-sectional thermal resistance is an inverse of a product of a heat transfer coefficient and a convective surface area.) In a particular example, a branching network is selected that includes fractal-like branching, a size-invariant terminal channel diameter, and flow path dimensions based on pump power requirements. Such branching networks can be similar to the branching configuration found in mammalian circulatory system or transport systems of other organisms.

Several representative embodiments described below are based on a micro-lamination fabrication process in which flow channels of approximately rectangular cross-sectional area are defined in a channel plate that is bonded to cover plates. Such flow channels are especially convenient for fabrication, but channels of other configurations can be provided such as channels having circular, elliptical, or other cross-sections. In addition, channel configurations are selected so that inconveniently large numbers of unconnected pieces needed for laminate formation can be avoided and to avoid multiple fluid exit ports in a bottom laminate that would require alignment with ends of terminal channels. Other channel configurations are possible.

Figure 1:
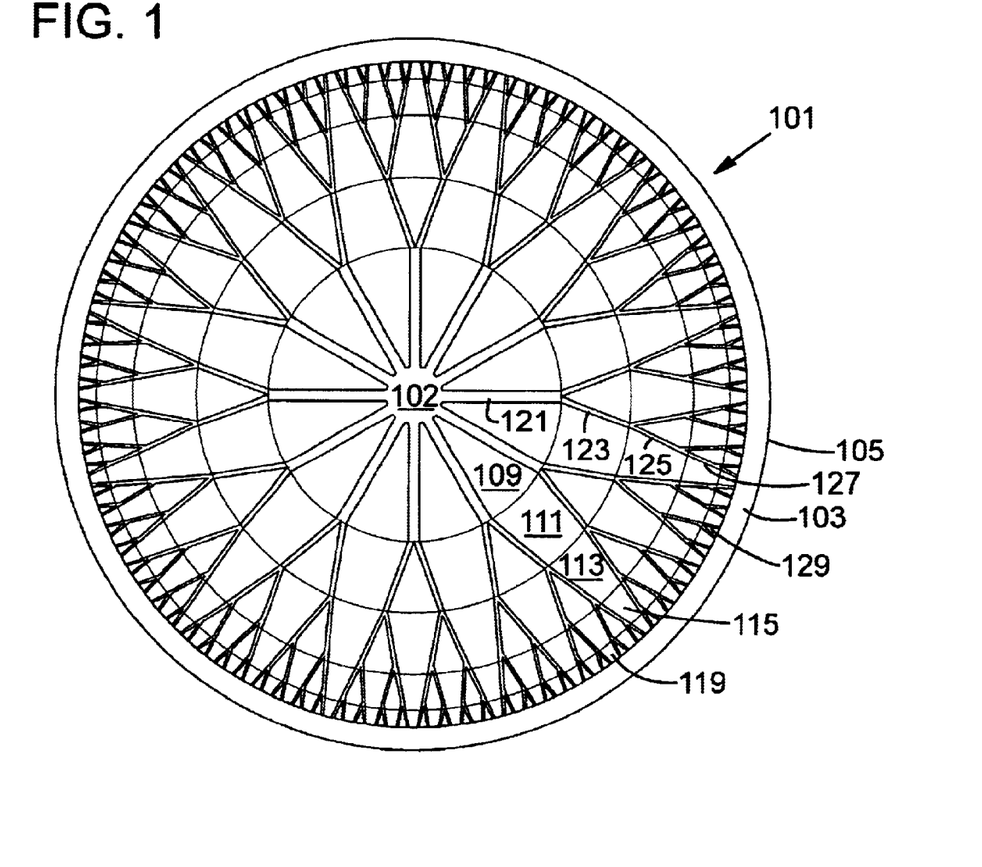
FIG. 1 is a sectional plan view of a heat sink illustrating a fractal-like branching network for n=2, m=4, D=2, β=0.7973, and γ=0.7071.

Referring to FIG. 1, a heat sink 101 includes an exit plenum 103 situated at a perimeter 105 and an inlet port 102 situated at or near a center of the heat sink 101. The heat sink 101 also includes a branching network 107 that comprises branching levels 109, 111, 113, 115, 119 corresponding to branching levels k=0, 1, 2, 3, 4, respectively. The branching levels 109, 111, 113, 115, 119 include respective channels 121, 123, 125, 127, 129. As shown in FIG. 1, each channel branches into two channels at transitions between the branching levels, but in other configurations the channels branch into two or more channels, different channels branch into different numbers of channels, or different numbers of branches are formed at different branching levels. The branching levels and channels of FIG. 1 can be selected based on the following equations:

$$\beta = \frac{d_{k+1}}{d_k} = n^{-1/\alpha} \tag{1}$$

$$\gamma = \frac{L_{k+1}}{L_k} = n^{-1/D} \tag{2}$$

wherein $d_k$ and $L_k$ are a channel diameter and a channel length of a channel in a $k^{th}$ branching level, γ and β are ratios of channel diameters and channel lengths, respectively, m is a total number of branching levels (exclusive of a $0^{th}$ level), n is a number of branches into which a single channel bifurcates, and D=2 corresponds to the dimensionality of the heat sink 101. A parameter α=2 for branching networks in which cross-sectional area is conserved. To reduce pump power, α=3, but α can be assigned other values. Three-dimensional heat sinks can be based on Equations 1–3 with D=3. An integer k identifies branching levels and ranges from 0 to m. For a configuration of the heat sink 101 in which the channels have rectangular cross-sections, a hydraulic diameter of a rectangular channel can be used instead of channel diameter d in Equation 1. The diameter ratio specified by Equation 1 can permit reduced power for flowing a heat transfer fluid through the heat sink 101.

Figure 2:
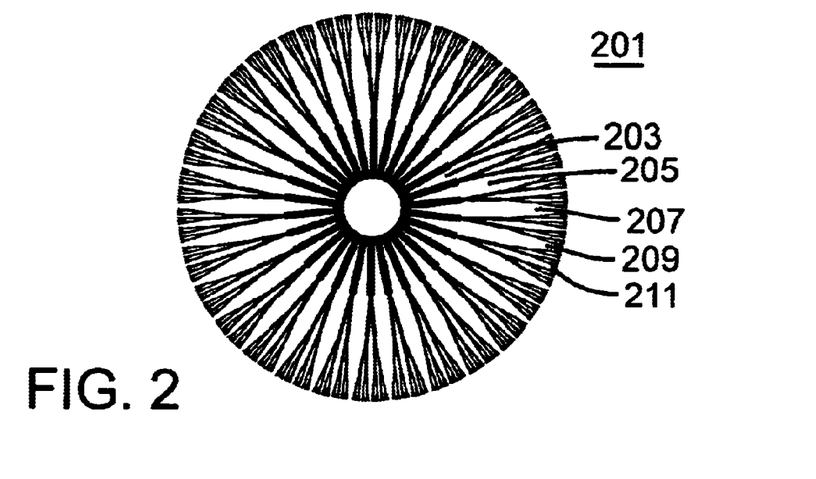
FIG. 2 is a plan view of a branching network that includes branching levels for m=0, 1, 2, 3, 4.

Referring to FIG. 2, an alternative branching network 201 includes branching levels 203, 205, 207, 209, 211 corresponding to branching levels for k=0, 1, 2, 3, 4, respectively. Other representative branching networks include fewer or additional branching levels, bifurcations into more than two channels in at least one branching level, or channels that have different cross-sections of channel lengths in one or more branching levels. In some embodiments, the branching network includes a variety of channel widths, lengths, and angles and can have an appearance similar to leaf vein structure.

Figure 3:
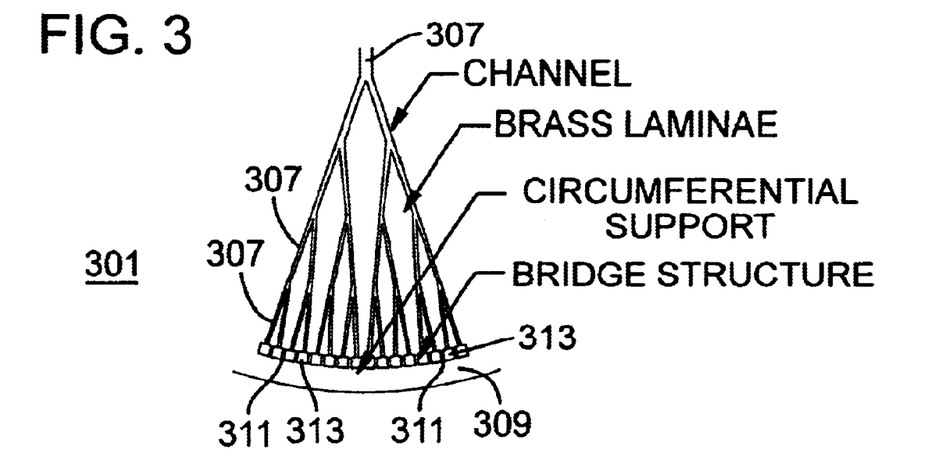
FIG. 3 is a plan view of a channel pattern that defines branching networks such as those of FIGS. 1–2.

The heat sink 101 of FIG. 1 can be conveniently fabricated as, for example, a laminated stack of layers. Referring to FIG. 3, a channel pattern 301 defines channels 307 that can be formed by a micro-machining process such as laser machining or an etching process such as a chemical or plasma etching process in brass, stainless steel, or other material. The channel pattern 301 includes bridges 311 and channel terminations 313 so that the channels 307 are defined in a single piece. Such a channel pattern facilitates fabrication as unconnected pattern pieces are avoided.

Figure 4:
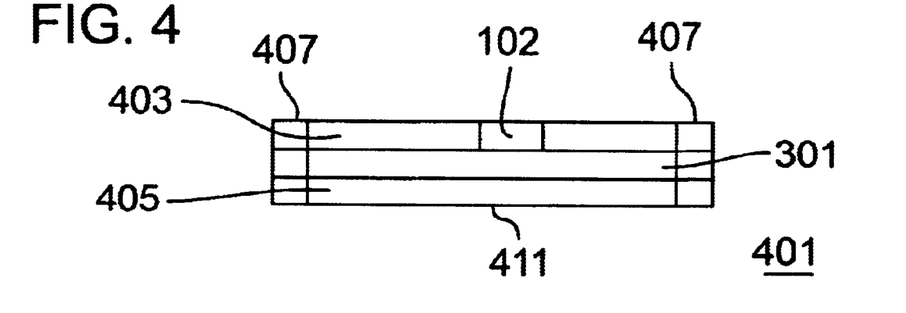
FIG. 4 is an elevational view of an intermediate assembly that includes a channel pattern prior to removal of a circumferential support.

Referring to FIG. 4, an intermediate assembly 401 includes layers 403, 405 to which the channel pattern 301 is bonded by diffusion bonding, with an adhesive, by soldering, or by another method. A perimeter region 407 of the intermediate assembly that includes the circumferential support 309 is removed following lamination.

In a particular embodiment, the heat sink 101 had a diameter of about 76 mm and the inlet port 102 had a diameter of about 6 mm. The inlet port 102 was configured for the introduction of a fluid perpendicular to and from behind a surface of the heat sink that is configured to thermally or physically contact an object to be cooled. As shown in FIG. 1, the heat sink 101 provides for approximately symmetric, radially directed fluid transport to the exit plenum 103.

Equation 1 above can be used to specify a $k^{th}$ level segment width $w_k$ wherein $d_h$ represents a hydraulic diameter that can be defined as:

$$d^h = \frac{4(wh)}{2w + 2h},$$

wherein w and h represent channel width and channel height, respectively. For a fixed channel height h, an associated channel width can be specified as:

$$w_k = \frac{w_{k+1} h}{\beta_k (w_{k+1} + h) - w_{k+1}}. \quad (4)$$

According to Equations 1–2, the diameter ratio β and the length ratio γ, are 0.7937 and 0.7071, respectively, for a two-dimensional plate and n=2 bifurcations.

For m=4 branching levels, $h_m$=0.5 mm, and $w_m$=0.2 mm, additional channel dimensions can be determined based on Equations 1, 2, and 4 for each branching level. Channel dimensions are summarized in Table 1. As shown in FIG. 1, a single channel in the $0^{th}$ level branch bifurcates into sixteen channels at the $4^{th}$ level branch. The heat sink 101 of FIG. 1 includes twelve $0^{th}$ level branches.

TABLE 1

Channel dimensions for a heat sink similar to that of FIG. 1.

| k | H (mm) | W (mm) | $d_h$ (mm) | L (mm) |
|---|---|---|---|---|
| 0 | 0.500 | 1.285 | 0.720 | 12.45 |
| 1 | 0.500 | 0.667 | 0.571 | 8.81 |
| 2 | 0.500 | 0.415 | 0.454 | 6.23 |
| 3 | 0.500 | 0.281 | 0.360 | 4.40 |
| 4 | 0.500 | 0.200 | 0.286 | 3.11 |

Branching network TMDs can be compared with conventional micro-channel TMDs using analyses based on laminar flow conditions. In two such analyses, flow is assumed to be both thermally and hydrodynamically developed. In one example, convective heat transfer surface areas are approximated based on hydraulic diameters. In an another analysis, thermal efficiencies are based on actual convective surface. In yet another analysis, flow is assumed to reinitiate boundary layer development (thermally and hydrodynamically) after each channel bifurcation. These analyses typically permit bounds on TMD properties to be estimated.

TABLE 2

Flow velocities, and hydraulic and thermal entry lengths (V, $L_t$, $L_h$, respectively) for a branching network TMD similar to that of FIG. 1. Entry lengths that are less than a length of a branching channel segment are marked with an asterisk (*).

| | Q = 5 ml/s | | | Q = 25 ml/s | | |
|---|---|---|---|---|---|---|
| k | V (m/s) | $L_t$ (mm) | $L_h$ (mm) | V (m/s) | $L_t$ (mm) | $L_h$ (mm) |
| 0 | 0.648 | 120 | 28 | 3.24 | 602 | 142 |
| 1 | 0.625 | 87 | 19 | 3.13 | 436 | 93 |
| 2 | 0.502 | 44 | 9.5 | 2.51 | 221 | 47 |
| 3 | 0.370 | 20 | 4.3* | 1.85 | 98 | 21 |
| 4 | 0.260 | 7.6 | 1.8* | 1.30 | 38 | 9.0 |

In additional embodiments, parameters other than the hydraulic diameter $d_h$ can be used to determine branching channel configuration. As channel width w increases and the ratio of w/h increases, the hydraulic diameter $d_h$ does not change correspondingly. As the number of branches (k) increases, the hydraulic diameter becomes less appropriate for estimating or specifying branching channel configurations. Alternatively, for a fixed channel height h and a flow area $w_k$ of a jth level, $$\frac{w_{k+1}}{w_k} = n^{-2/3}.$$

This relationship can be used instead of the relationship $$\frac{d_{k+1}}{d_k} = n^{-1/3}$$

of Equation 1. In addition, α can be assigned values other than 2 or 3, varying the ratio of the flow areas.

In additional embodiments, the branching channel can be arranged so that the angle between bifurcating channels is reduced and/or the number of channels originating from the plenum is increased or reduced. Increasing the number of $0^{th}$ level channels can require an increase in plenum diameter.

TMDs can typically be designed based on a selected terminal channel length and channel diameter or cross-sectional area, the heat sink surface area, and inlet plenum dimensions. The number of $0^{th}$ level branches, the number of bifurcating levels, and the branching angle of the array can then be determined. Channel width of a terminal channel can be limited by the fabrication process in order to, for example, avoid bridging of the channels during the diffusion bonding process. Length of the terminal channel can be estimated (for a two-dimensional heat sink) based on a thermal time constant for convective heat transfer and the average velocity through the terminal channel. Finally, because the thermal resistance to convection, e.g. cross-sectional thermal resistance, is decreased for each bifurcating channel, the surface temperature of the heat sink is anticipated to become more uniform than a parallel channel heat sink when subjected to a constant flux boundary condition.

While the branching network 103 of FIG. 1 is illustrated as a portion of a TMD, such branching networks can also be configured for other applications such as, for example, fluid mixing. For applications such as fluid mixing, the branching network can be defined in other materials such as fused silica, glass, polycarbonates, and semiconductors (e.g., silicon). For branching networks constructed with some other materials, layers can be ultrasonically welded together rather than diffusion bonded as with metal layers. For materials such as a silicon wafer, wet or dry etching can be used.

Figure 5A:
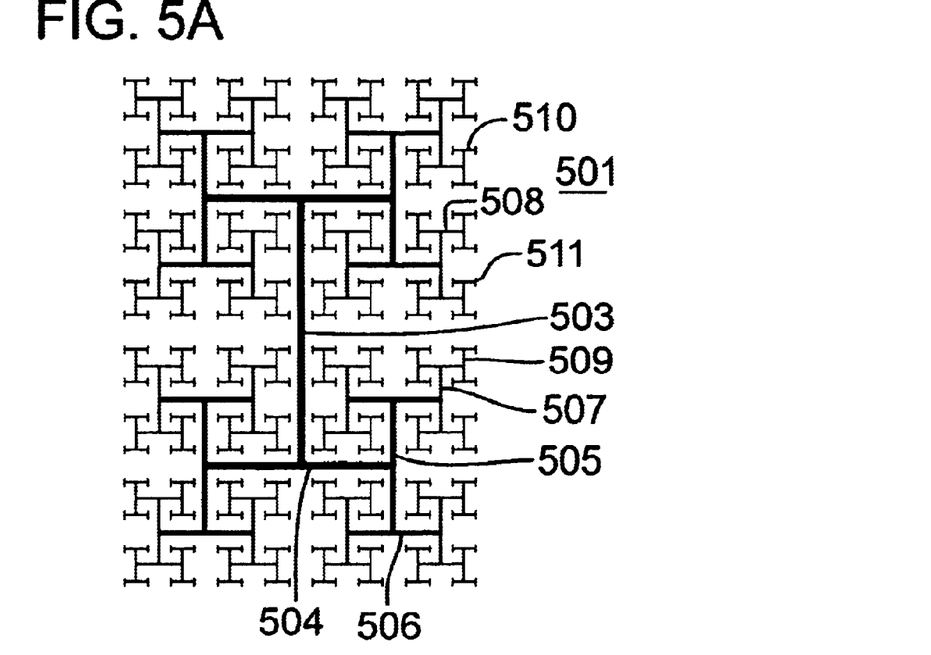
FIG. 5A is a plan view of a branching network.
Figure 5B:
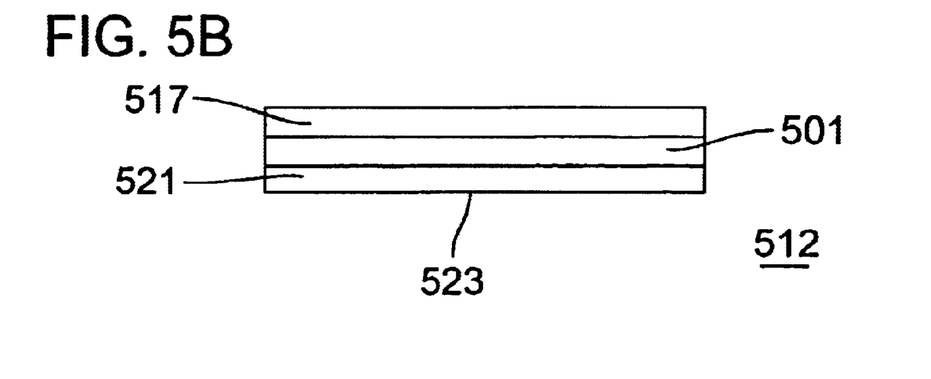
FIG. 5B is an elevational view of a thermal management device (TMD) that includes the branching network of FIG. 5A.

With reference to FIG. 5, a branching network 501 comprises channels 503–511 that are associated with corresponding branching levels. In the branching network 501, channels terminate in four channels in a successive branching level. The branching network 501 approximates a "square fractal-like" configuration and can be included in various TMDs. In a representative embodiment, a TMD 512 includes the branching network 501. In the TMD 512, flow is introduced to and removed from the branching network 501 with a fluid inlet and an exit plenum, respectively, that are defined in a termination layer 517. The fluid inlet can be configured to direct fluid to the channel 503 and the exit plenum configured to receive fluid from the channels 511. A second termination layer 521 includes a heat transfer surface 523 configured to receive, for example, an integrated circuit or other device. In another representative embodiment, fluid can be provided to the channel 503 (or several of the larger channels such as the channels 503, 505) from top plenums defined in end regions of one or both of the layers 517, 519. Such a TMD can be more readily manufactured, but can permit increased temperature differences at the surface 523.

Figure 6:
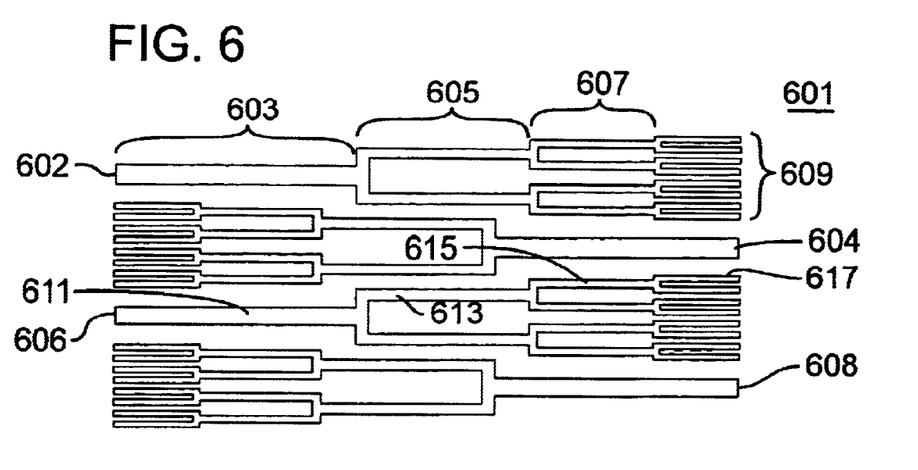
FIG. 6 is a plan view of a branching network that includes oppositely oriented branched channels.

Referring to FIG. 6, a branching network 601 includes branched channels 602, 604, 606, 608 that define branching levels 603, 605, 607, 609. In a TMD, the branching level 609 is in communication with an exit plenum and the branching level 603 is in communication with an entrance plenum. The branched channels 602, 604, 606, 608 include channel segments 611, 613, 615, 617 that have square, rectangular, circular, elliptical, or other cross-section.

Branched channels are illustrated above with reference to heat sinks and other thermal management applications but can also be included in mixing devices. For example, fluid streams to be mixed can be introduced into channels in higher-order (i.e., smaller) channels so that fluid flow is oppositely directed to the fluid flow direction typically used in heat transfer applications. As channels containing different fluids merge, interfluid layers form over which diffusion occurs. In subsequent channel mergings, additional fluid layers are formed. Fluids can be mixed before reaching the exit plenum (i.e., the inlet plenum for heat transfer) without an active mixing device or turbulence. Such a mixer can be compact and passive. For mixing applications, three-dimensional (D=3) branching channels can be advantageous.

Branched channels can also be included in bioreactors and chemical reactors. Such branched channels can be two or three dimensional and channels can divided into two or more channels at some or all branching level transitions. In such reactors, reactions can occur in a fluid layer at channel walls of the larger channels and at laminar flow boundaries. Typically, flow is directed from larger channels to smaller channels. Such reactors can be compact, use little power for pumping fluids, and be less likely to clog than a series of long, parallel micro-channels.

Figures 7A, 7B, 7C, 7D:
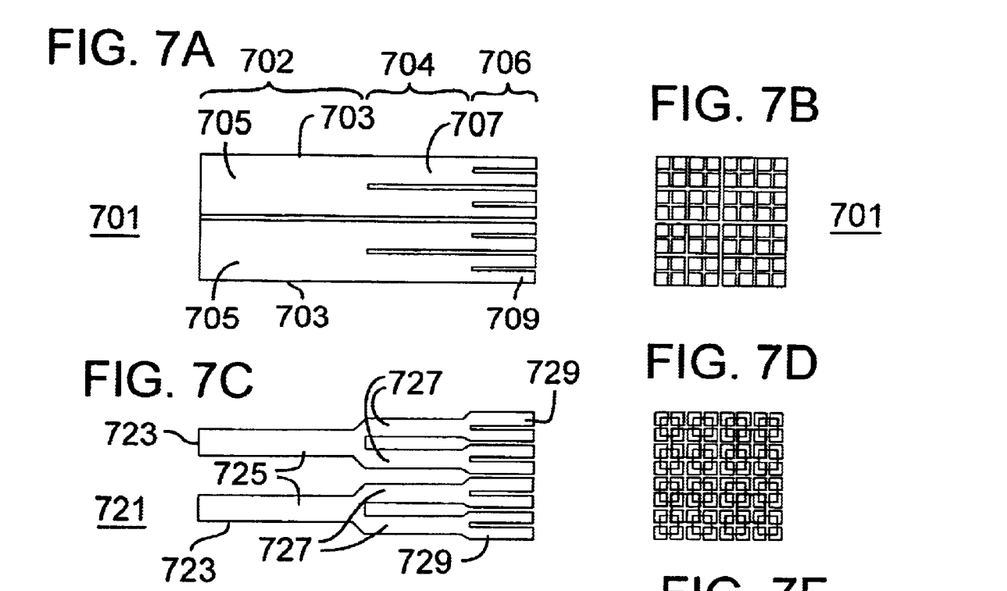
FIGS. 7A–7B are sectional and projected end views, respectively, of a three-dimensional branching network having an approximately constant flow cross-sectional area.
FIGS. 7C–7D are sectional and projected end views, respectively, of a three-dimensional branching network that includes channels having a square cross-section and configured so that flow cross-sectional area is not constant.

Referring to FIGS. 7A–7B, a three-dimensional branching network 701 includes branched channels 703 that comprise flow channels 705, 707, 709 corresponding to three branching levels 702, 704, 705, respectively. The flow channels 705, 707, 709 have approximately square cross-sections and square terminations 711 of the channels 709 are shown in FIG. 7B. The branched channels 703 provide an approximately equal flow cross-sectional areas from level to level.

Figure 7E:
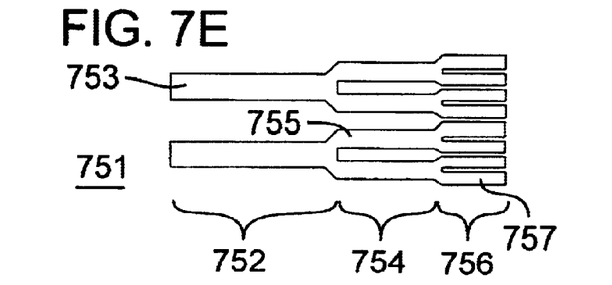
FIGS. 7E–7F are sectional and projected end views, respectively, of a three-dimensional branching network that includes channels having circular cross-sections and configured so that flow cross-sectional area is not constant.
Figure 7F:
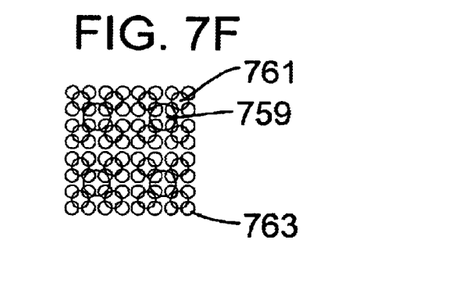

With reference to FIGS. 7C–7D, a three-dimensional branching network 721 comprises branched channels 723 that are formed by flow channels 725, 727, 729 that correspond to three branching levels. The flow channels have approximately square cross-sections but flow cross-sectional area is not constant from level to level. Referring to FIGS. 7E–7F, a branching network 751 includes flow channels 753, 755, 757 corresponding to branching levels 752, 754, 756, respectively. As shown in FIG. 7F the channels 753, 755, 757 have approximately circular cross-sections 759, 761, 763, respectively. The branching network 751 does not maintain constant flow cross-sectional area. Changes in flow cross-sectional area from branching level to branching level can be specified based on scaling channels based on the number of channels into which a channels divides. For example, to preserve cross-sectional area, a square root of a number of channels n can be used.

Figure 8:
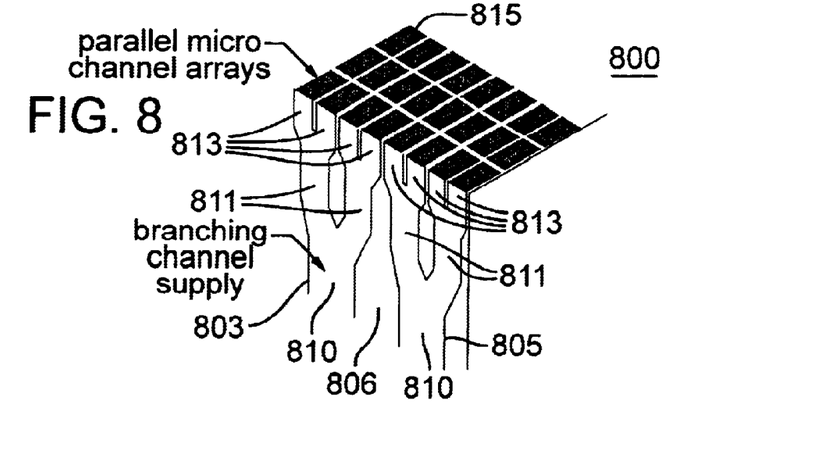
FIG. 8 is a partial sectional view of a thermal management device that includes micro-channel arrays configured to receive a fluid from or deliver a fluid to a branching network.

With reference to FIG. 8, a TMD 800 comprises a branching network 801 that includes branching channels 803, 805 within a volume 806. The branching channels 805, 807 include channels 810–812 corresponding to three branching levels. Each of the channels 812 terminates at a respective micro-channel array 815 that includes a series of parallel micro-channels. The micro-channel arrays 815 can be configured to remove heat from (or deliver heat to) an area corresponding to an area spanned by the micro-channel arrays. As shown in FIG. 8, the micro-channels can provide a relatively high coolant flux to devices such as solar panels.

Figure 9A:
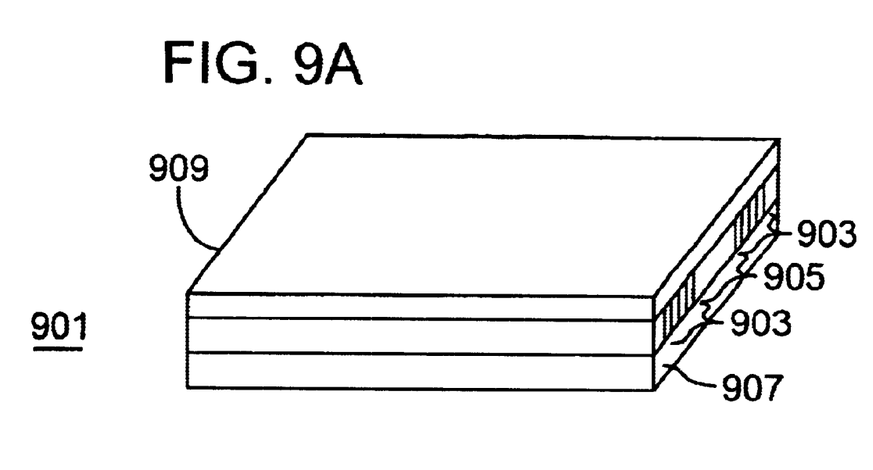
FIGS. 9A–9B are elevational views of heat exchangers that include branching networks.
Figure 9B:
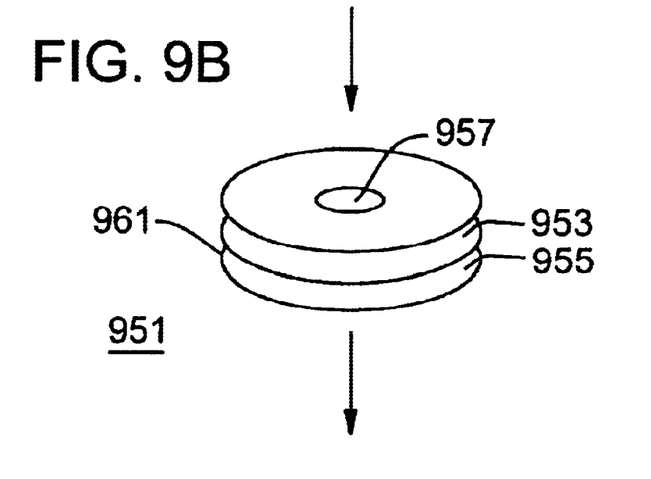

FIGS. 9A–9B are perspective views of heat exchangers 901, 951, respectively. The heat exchanger 901 includes alternating arranged branching networks similar to the arrangement of FIG. 6. As shown in FIG. 9A, the branching networks terminate in high order channels 903 and $0^{th}$ order channels 905 at an edge 907. Channel terminations at an edge 909 are not shown. The heat exchanger 951 includes branching networks 953, 955 similar to those of FIG. 1. The branching network 953 includes a central plenum 957. The branching network 955 also includes such a plenum that is not shown. Additional plenums at a perimeter 961 are not shown.

Branching networks have applications in addition to thermal management. Such networks can be used to mix or separate fluid flows. In mixing applications, branching networks can be configured so that boundaries between laminar flows of different fluids permit diffusive mixing or fluids or constituents thereof. Two dimensional branching networks are especially convenient as channels in such networks can be defined using photolithographic and other processes derived from, for example, semiconductor manufacturing.

It will be apparent to those skilled in the art that the examples described above can be modified in arrangement and detail without departing from the scope of the invention and the invention is not to be limited to these examples. We claim all that is encompassed by the appended claims.

We claim:

1. A thermal management device (TMD), comprising:
an inlet configured to receive a fluid;
a branching network situated to receive the fluid from the inlet; and
an outlet configured to receive the fluid from the branching network, wherein the branching network includes m branching levels having flow channels configured so that $$\beta = \frac{d_{k+1}}{d_k} = n^{-1/\alpha},$$
$$\gamma = \frac{L_{k+1}}{L_k} = n^{-1/D}, \text{ and}$$

wherein m is a positive integer greater than one, k is an integer such that $1 \leq k \leq m$, $d_k$ and $L_k$ are a flow channel diameter and a channel length of a flow channel in a $k^{th}$ branching level, $\gamma$ and $\beta$ are ratios of channel diameters and channel lengths, respectively, n is a number of branches into which a single channel divides, $\alpha$ is a positive number greater than or equal to about 2, and D=2 for a two dimensional branching network and D=3 for a three dimensional branching network.

2. The TMD of claim 1, wherein $\alpha$ is between about 2 and 3.

3. The TMD of claim 1, wherein the diameters $d_k$ are hydraulic diameters.

4. The TMD of claim 1, wherein the branching network includes flow channels that are directed substantially radially with respect to the inlet.

5. The TMD of claim 1, wherein the branching network defines flow channels that extend along a flow axis.

6. A thermal management device (TMD), comprising:
an inlet configured to receive a fluid;
a branching network situated to receive the fluid from the inlet; and
an outlet configured to receive the fluid from the branching network, wherein the branching network includes branching levels having flow channels configured so that $$\frac{L_{k+1}}{L_k} = n^{-1/D}, \text{ and}$$
$$\frac{w_{k+1}}{w_k} = n^{-2/3},$$

wherein D=2 for a two dimensional branching network and D=3 for a three dimensional branching network, $w_k$ and $L_k$ are a flow channel cross-sectional area and a channel length of a flow channel in a $k^{th}$ branching level, respectively, n is a number of branches into which a single channel divides, and k is an integer such that $k \geq 1$.

7. The TMD of claim 6, wherein D=2.

8. A thermal management device (TMD), comprising:
a branching network pattern layer that defines at least a first and a second branching level, wherein the first branching level includes at least $N_1$ flow channels of length $L_1$ and hydraulic diameter $d_1$, and the second branching level includes at least $N_2$ flow channels of length $L_2$ and hydraulic diameter $d_2$, wherein $N_1$ and $N_2$ are integers and $N_1 < N_2$, $L_1 > L_2$, and $d_1 > d_2$; and
first and second cover layers attached to the branching network pattern layer.

9. The TMD of claim 8, wherein the branching network pattern layer includes m branching levels having flow channels configured so that $$\frac{L_{k+1}}{L_k} = n^{-1/D}, \text{ and}$$
$$\frac{w_{k+1}}{w_k} = n^{-2/3},$$

wherein m is a positive integer, k is an integer such that $1 \leq k \leq m$, $w_k$ and $L_k$ are a flow channel cross-sectional area and a channel length of a flow channel in a $k^{th}$ branching level, respectively, n is a number of branches into which a single channel divides, and D=2 for a two dimensional branching network and D=3 for a three dimensional branching network.

10. The TMD of claim 8, wherein the branching channel network layer includes a perimeter bridge portion.

11. A flow network, comprising m branching levels having flow channels configured so that $$\frac{L_{k+1}}{L_k} = n^{-1/D}, \text{ and}$$
$$\frac{w_{k+1}}{w_k} = n^{-2/3},$$

wherein m is a positive integer, k is an integer such that $1 \leq k \leq m$, $w_k$ and $L_k$ are a flow channel cross-sectional area and a channel length of a flow channel in a $k^{th}$ branching level, respectively, n is a number of branches into which a single channel divides, and D=2 for a two dimensional branching network and D=3 for a three dimensional branching network.

12. The flow network of claim 11, wherein D=2.

13. A thermal management device (TMD), comprising:
an inlet configured to receive a fluid;
a branching network that includes a first branching level configured to receive the fluid from the inlet, the first branching level including at least $N_1$ flow channels of length $L_1$ and hydraulic diameter $d_1$, and a second branching level that includes at least $N_2$ flow channels of length $L_2$ and hydraulic diameter $d_2$, wherein $N_1 < N_2$, $L_1 > L_2$, and $d_1 > d_2$; and
an outlet configured to receive the fluid from the second branching level of the branching network.

14. The TMD of claim 13, wherein the branching network includes an intermediate branching level having $N_{int}$ flow channels of length $L_{int}$ and hydraulic diameter $d_{int}$, wherein $N_{int}$ is an integer and $N_1 < N_{int} < N_2$, $L_1 > L_{int} > L_2$, and $d_1 > d_{int} > d_2$.

15. The TMD of claim 14, wherein a ratio $L_1/L_{int}$ is substantially equal to a ratio $L_{int}/L_2$ and a ratio $d_1/d_{int}$ is substantially equal to a ratio $d_{int}/d_2$.

16. The TMD of claim 13, wherein the flow channels of the first and second branching levels have rectangular cross sections.

17. The TMD of claim 13, wherein the flow channels of the first and second branching levels have circular cross sections.

18. The TMD of claim 13, the flow channels of the first and second branching networks are directed substantially radially with respect to the inlet.

* * * * *

UNITED STATES PATENT AND TRADEMARK OFFICE
CERTIFICATE OF CORRECTION

PATENT NO. : 6,688,381 B2
DATED : February 10, 2004
INVENTOR(S) : Pence et al.

It is certified that error appears in the above-identified patent and that said Letters Patent is hereby corrected as shown below:

Column 4,
Line 57, should read -- $N_m = n_m$ (3)--.

Column 8,
Line 3, "can divided" should read -- can be divivded --.
Line 32, "channels" should read -- channel --.

Column 10,
Line 62, "the flow" should read -- wherein the flow --.

Signed and Sealed this

Fifth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,688,381 B2 Page 1 of 1
DATED : February 10, 2004
INVENTOR(S) : Pence et al.

It is certified that error appears in the above-identified patent and that said Letters Patent is hereby corrected as shown below:

Column 8,
Line 3, "can divided" should read -- can be divided --.

Signed and Sealed this

Fifteenth Day of November, 2005

JON W. DUDAS
*Director of the United States Patent and Trademark Office*